(12) United States Patent
Moon (10) Patent No.: US 6,338,978 B1
(45) Date of Patent: Jan. 15, 2002

(54) IMAGE SENSOR AND METHOD FOR FABRICATING THE SAME

(75) Inventor: Sang Ho Moon, Seoul (KR)

(73) Assignee: Hyundai Electronics Industries Co., Ltd, Kyoungki-do (KR)

( * ) Notice: Subject to any disclaimer, the term of this patent is extended or adjusted under 35 U.S.C. 154(b) by 0 days.

(21) Appl. No.: 09/637,786

(22) Filed: Aug. 11, 2000

Related U.S. Application Data (62) Division of application No. 09/213,413, filed on Dec. 17, 1998, now Pat. No. 6,147,373.

(30) Foreign Application Priority Data

Jan. 16, 1998 (KR) ............................................. 98-1223

(51) Int. Cl.[7] .............................................. H01L 21/00
(52) U.S. Cl. ...................................................... 438/57
(58) Field of Search ........................ 438/48–56, 57–66, 438/173, 800

(56) References Cited

U.S. PATENT DOCUMENTS

| | | | |
|---|---|---|---|
| 4,455,575 A | * | 6/1984 | Murakoshi ................... 358/213 |
| 5,083,171 A | | 1/1992 | Komatsu et al. |
| 5,463,232 A | | 10/1995 | Yamashita et al. |
| 5,519,207 A | | 5/1996 | Morimoto |
| 5,736,756 A | | 4/1998 | Wakayama et al. |

\* cited by examiner

*Primary Examiner*—Charles Bowers
*Assistant Examiner*—Craig Thompson
(74) *Attorney, Agent, or Firm*—Fleshner & Kim, LLP.

(57) ABSTRACT

A solid state image sensor according to the present invention includes a p-type conductivity type well formed in a surface of an n-type conductivity type semiconductor substrate in which a photoelectric conversion region is defined. A photoelectric conversion device (i.e., photodiode) is formed of a PD-N region and a PD-P region in a surface of the p-type conductivity well in the photoelectric conversion region, for converting a signal of light to an electrical signal. A vertical charge transfer region is formed in a surface of the p-type conductivity well in which the photodiode is not formed, and a channel stop layer is formed in a surface of the p-type conductivity well around the PD-N region except for a region between one side of the photodiode and the vertical charge transfer region. A gate insulating film is formed on the semiconductor substrate except for the photodiode, and a transfer gate is formed on the gate insulating film. A first insulating film is formed on the transfer gate, and a second insulating film is formed on the gate insulating film at both sides of the transfer gate. A light-shielding layer is formed at the sides of the photodiode and on the first and second insulating films to be electrically connected with the photodiode. A third insulating film is formed on the light-shielding layer including the photodiode.

13 Claims, 7 Drawing Sheets

IMAGE SENSOR AND METHOD FOR FABRICATING THE SAME

This application is a Divisional of application Ser. No. 09/213,413 filed Dec. 17, 1998 now U.S. Pat. No. 6,147,373.

BACKGROUND OF THE INVENTION

1. Field of the Invention

The present invention relates to a sensor and a method for fabricating the same, and more particularly, to an image sensor and a method for fabricating the same.

2. Background of the Related Art

Figure 1:
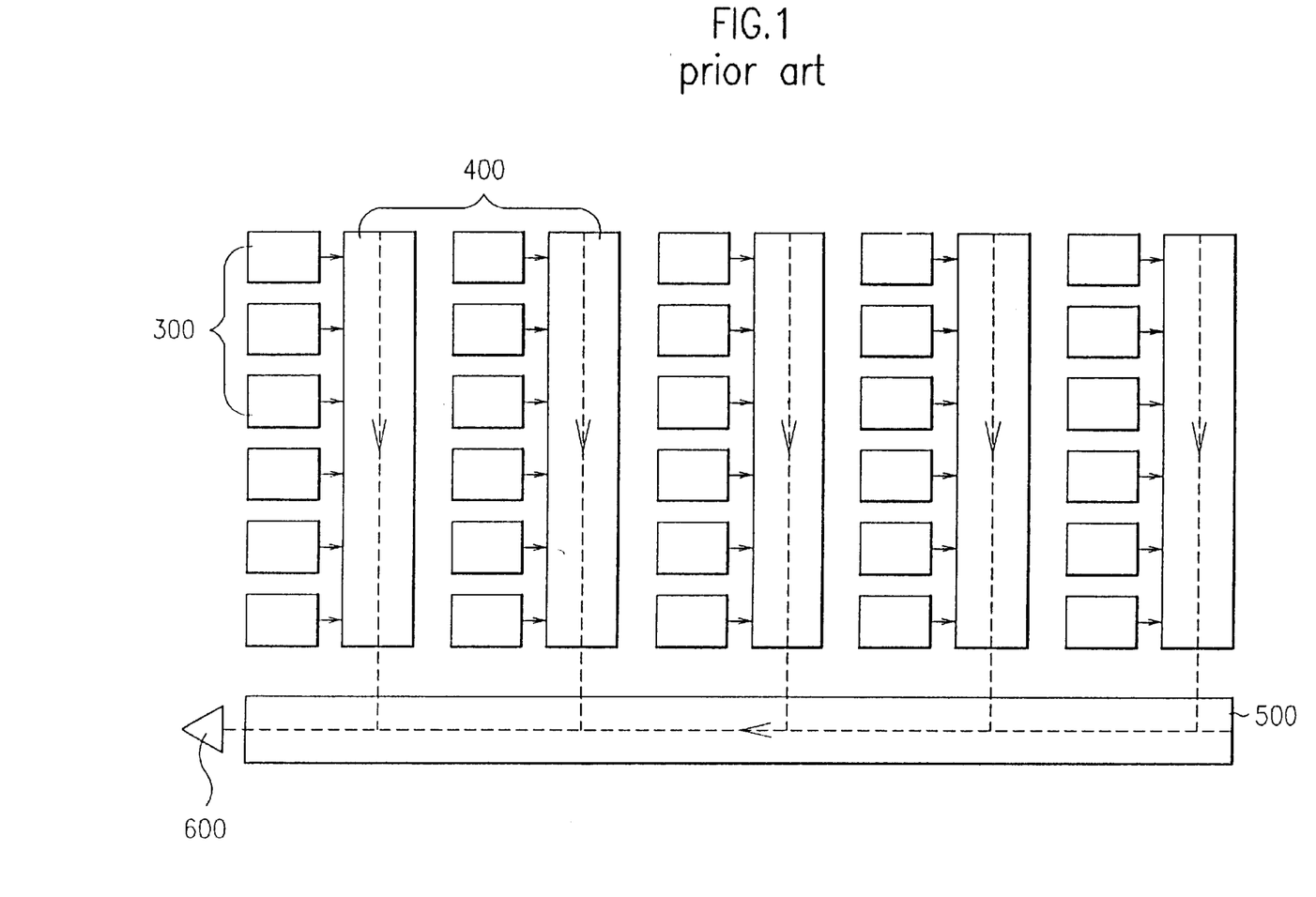
FIG. 1 is a layout illustrating a conventional solid state image sensor.
Figure 2:
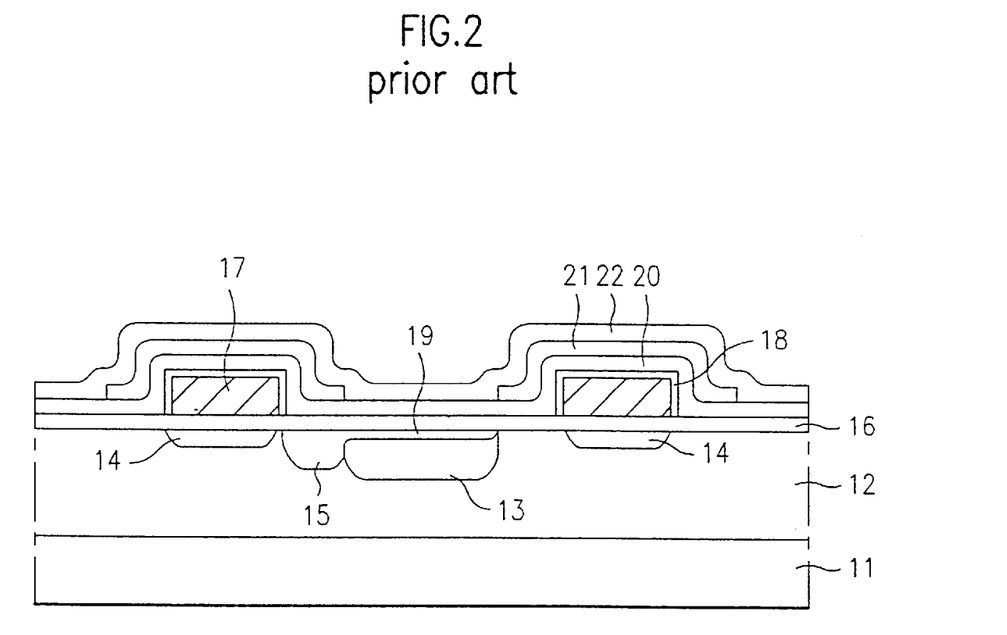
FIG. 2 is a sectional view illustrating a conventional solid state image sensor of FIG. 1.

FIG. 1 is a layout illustrating a conventional solid state image sensor, and FIG. 2 is a sectional view illustrating a conventional solid state image sensor. FIGS. 3A to 3F are sectional views illustrating a method for fabricating a conventional solid state image sensor of FIGS. 1 and 2.

As shown in FIG. 1, a solid state image sensor includes a plurality of photodiode regions 300, vertical charge transfer regions 400, a horizontal charge transfer region 500, and a sense amplifier 600. The plurality of photodiode regions 300 converts a signal of light to an electrical image transfer signal. Each of the vertical charge transfer region 400 transfers the image charge formed by the photodiodes 300 in a vertical direction. The horizontal charge transfer region 500 transfers the image charge transferred in a vertical direction by the vertical charge transfer region 400 to a horizontal direction. The sense amplifier 600 senses the image signal charge transferred in the horizontal direction by the horizontal charge transfer region 500.

As shown in FIG. 2, a conventional solid state image sensor includes a p-type well 12 formed in a surface of an n-type semiconductor substrate 11 in which a photoelectric conversion region is defined. A photodiode is formed of a PD-N region 13 and a PD-P region in a surface of the p-type well 12 in the photoelectric conversion region, for converting a signal of light to an electrical signal. A vertical charge transfer region 14 is formed in the surface of the p-type well 12 in which the photodiode is not formed, and a channel stop layer 15 is formed in the surface of the p-type well 12 around the photodiode except for a portion between one side of the photodiode and the vertical charge transfer region 14.

A gate insulating film 16 is formed on the semiconductor substrate 11 including the vertical charge transfer region 14 and the photodiode, and a transfer gate 17 is formed on the gate insulating film 16 except for the photodiode. A first insulating film 18 is formed on a surface of the transfer gate 17, and a second insulating film 20 is formed on the gate insulating film 16 including the first insulating film 18. A light-shielding layer 21 is formed on the second insulating film 20 except for the photodiode, and a third insulating film 22 is formed on the light-shielding layer 21 including the second insulating film 20.

Figure 3A:
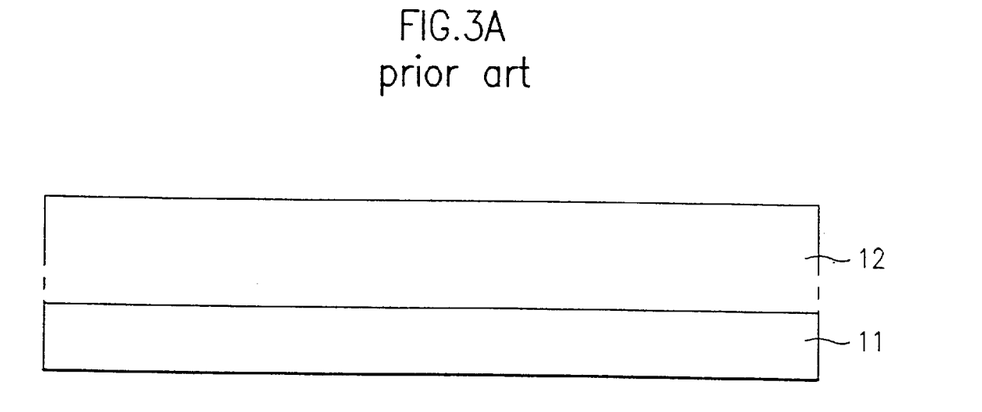
FIGS. 3A to 3F are sectional views illustrating a method for fabricating a conventional solid state image sensor.

A conventional method for fabricating a solid state image sensor will be described with reference to FIGS. 3A to 3F. As shown in FIG. 3a, a p-type impurity ion is selectively implanted into a predetermined region in a surface of an n-type semiconductor substrate 11 in which a photoelectric conversion region is defined. A p-type well 12 is then formed by a drive-in diffusion process.

Figure 3B:
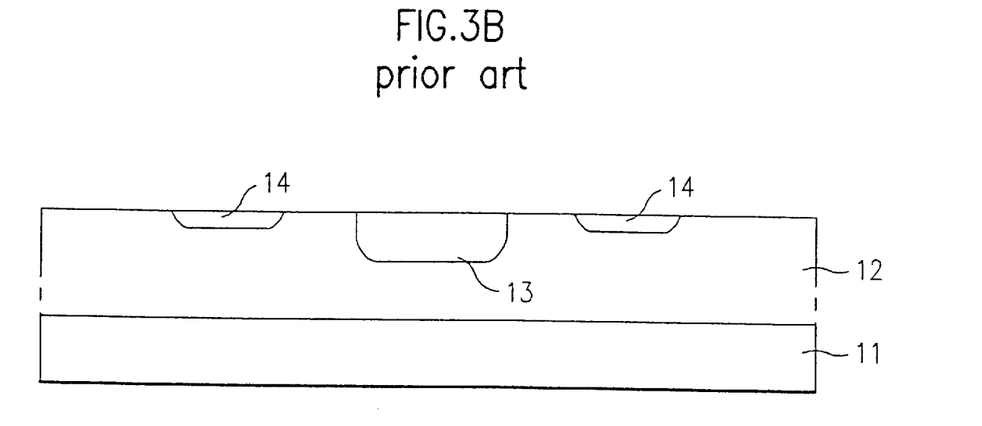

As shown in FIG. 3B, an n-type impurity ion is implanted into a surface of the p-type well 12 in the photoelectric conversion region. A PD-N region 13 is then formed by drive-in diffusion process. Subsequently, a heavily doped n-type impurity ion is implanted into the surface of the p-type well 12 in which the PD-N region 13 is not formed. A vertical charge transfer region 14 is then formed by a drive-in diffusion process.

Figure 3C:
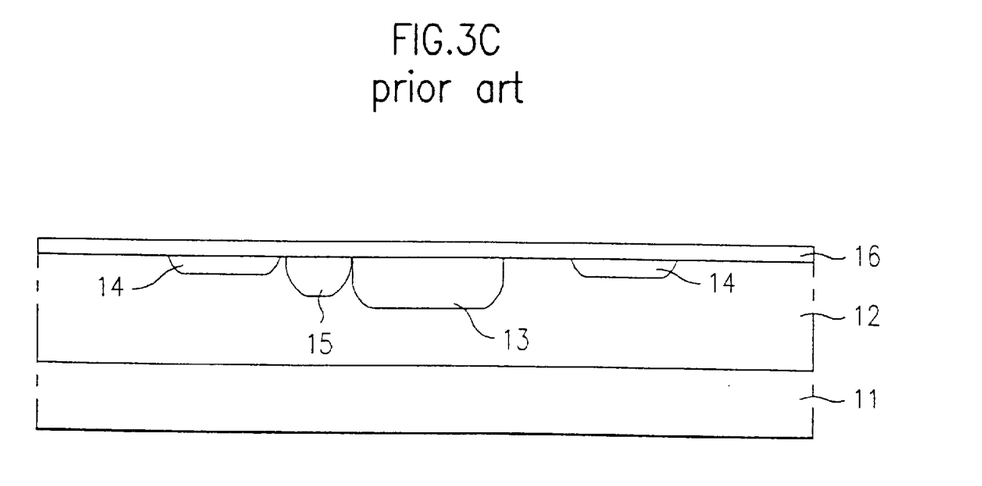

As shown in FIG. 3C, a heavily doped p-type impurity ion of energy lower than that to form the PD-region 13 is implanted into the surface of the p-type well 12 around the PD-N region 13 except for a portion between one side of the PD-N region 13 and the vertical charge transfer region 14. A channel stop layer 15 is then formed by a drive-in diffusion process. A gate insulating film 16 is formed on an entire surface of the semiconductor substrate 11 in which the vertical charge transfer region 14 and the channel stop layer 15 are formed.

Figure 3D:
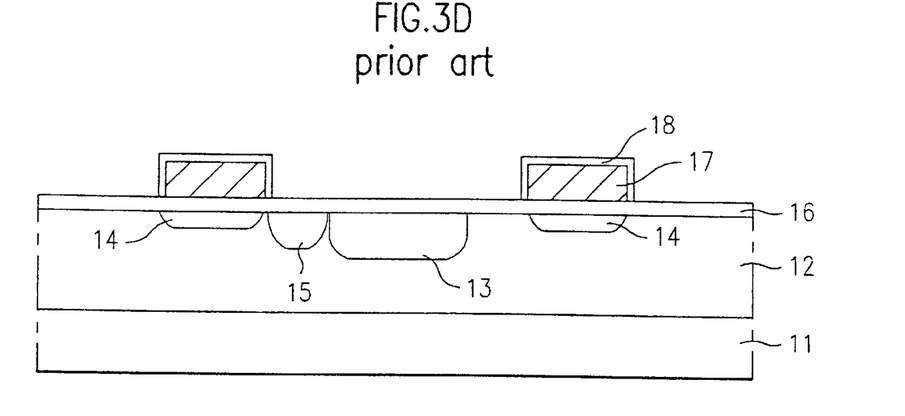

As shown in FIG. 3D, a polysilicon and a first photoresist are sequentially formed on the gate insulating film 16. The first photoresist is selectively patterned by exposure and developing processes to remain over the vertical charge transfer region 14. Subsequently, the polysilicon is selectively etched using the patterned first photoresist as a mask to form a transfer gate 17. The first photoresist is then removed. A first insulating film 18 is grown on a surface of the transfer gate 17 by a thermal oxidation process.

Figure 3E:
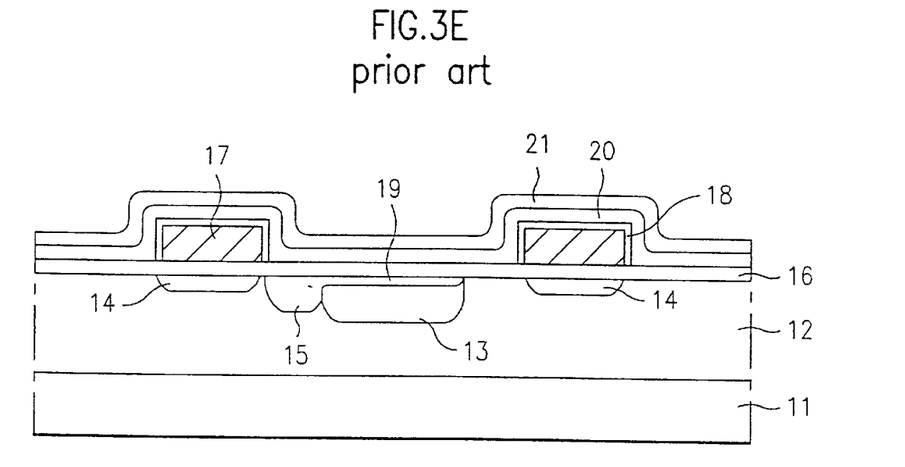

As shown in FIG. 3E, the heavily doped p-type impurity ion of energy lower than that to form the channel stop layer 15 is implanted into the surface of the p-type well 12 in the photoelectric conversion region. A PD-P region 19 is then formed with a thin thickness by a drive-in diffusion process. Thus, a photodiode with the PD-N region 13 and the PD-P region 19 is formed.

Figure 3F:
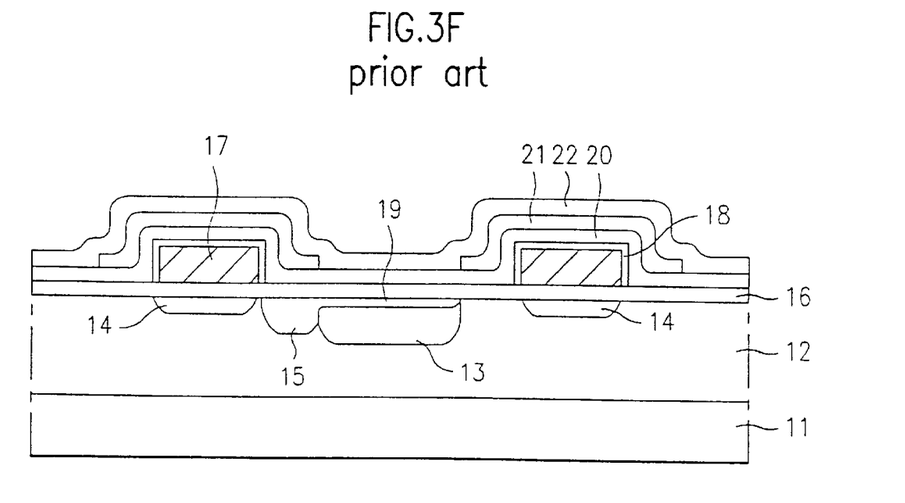

A second insulating film 20 and a light-shielding layer 21 are sequentially formed on the entire surface including the first insulating film 18. As shown in FIG. 3F, a second photoresist is deposited on the light-shielding layer 21 and then the second photoresist is selectively patterned by exposure and developing processes, so that the second photoresist over the photodiode is removed.

Subsequently, the light-shielding layer 21 is selectively etched using the second patterned photoresist as a mask. The second photoresist is then removed. A third insulating film 22 is formed on the entire surface including the selectively etched light-shielding layer 21.

In the conventional solid state image sensor, a signal charge stored in the photodiode is transferred to the vertical charge transfer region 14 by a clock signal applied to the transfer gate 17 and then is moved in the vertical direction. A hole or the positive charge is then removed in the PD-P region 19.

The PD-N region 13 is originally floating. However, if a high clock signal is If applied to the transfer gate 17, the signal charge in the PD-N region 13 is transferred to the vertical charge transfer region 14 and electrons are thus lost. As a result, the PD-N region 13 is pinched off. In this state, if the signal charge occurs again, the potential of the PD-N region 13 ascends, but fails to ascend more than Vsdl (saddle potential) of the p-type well 12.

The vertical charge transfer region 14 has high potential because a voltage of the transfer gate 17 is added to the pinched off potential of the PD-N region 13. At this time, a high voltage is applied to the transfer gate 17 because the device is operated by deep depletion mode.

However, the conventional solid state image sensor and the method for fabricating the same have several problems and disadvantages. If a surface of the photodiode is damaged or contaminated by a heavy metal in the course of the process steps, a noise charge occurs, and the noise charge flows to the photodiode. In addition, since the gate insulating film is formed on the semiconductor substrate including the photodiode, the incident light directly flows to the vertical charge transfer region through the gate insulating film, thereby causing a Smear phenomenon.

SUMMARY OF THE INVENTION

An object of the present invention is to obviate one or more of the problems and/or disadvantages of the related art.

Another object of the present invention is to prevent the occurrence of a Smear phenomenon.

A further object of the present invention is to prevent a noise charge from flowing to a photodiode.

To achieve these and other advantages and in accordance with the purpose of the present invention, as embodied and broadly described, a solid state image sensor according to the present invention includes a semiconductor substrate, a plurality of photoelectric conversion devices in a matrix arrangement in a surface of the semiconductor substrate, a plurality of vertical charge transfer regions formed in one direction in a surface of the semiconductor substrate between the photoelectric conversion devices, a gate insulating film formed on the semiconductor substrate except for each of the photoelectric conversion devices, a plurality of transfer gates formed on the gate insulating film, a first insulating film formed on a surface of each transfer gate, a second insulating film formed at sides of the first insulating film, a light-shielding layer formed on the first and second insulating films, the light shielding layer being connected with the photoelectric conversion devices, and a third insulating film formed on the light-shielding layer including each of the photoelectric conversion devices.

The present invention can be achieved in a whole or in parts by a sensor comprising: a substrate having a well region; a photoelectric conversion region formed in a surface of the well region; a first charge transfer region formed in the surface of the well region and spaced from the photoelectric conversion region by a prescribed distance; a first insulation film formed on the first charge transfer region; a first conductor formed on the first insulation film and coupled for receiving a control signal; a second insulation film formed on the first conductor; and a second conductor, serving as an electro-magnetic shielding layer, formed on the second insulation film, wherein the second conductor is coupled to the photoelectric conversion region.

The present invention can be achieved in a whole or in parts by the image sensor comprising a) a substrate; b) a first charge transfer region formed in a surface of the substrate in a first direction; c) a plurality of photoelectric conversion regions formed in the surface of the substrate and next to the first charge transfer region, the first charge transfer region receiving charges from the plurality of photoelectric conversion regions, d) a plurality of transfer gates formed over the first charge transfer, each transfer gate formed next to a corresponding photoelectric conversion region, wherein each transfer gate comprises: i) a first insulation film formed on the first charge transfer region; ii) a first conductor formed on the first insulation film and coupled for receiving a control signal; iii) a second insulation film formed on the first conductor; and e) a second conductor, serving as an electromagnetic shielding layer, formed over the plurality of transfer gates and the first charge transfer region, the second insulation film, wherein said second conductor is coupled to the plurality of photoelectric conversion regions; and a second charge transfer region formed in the surface of the substrate and receiving charges from the first charge transfer region.

In another aspect, a method for fabricating a solid state image sensor of the present invention includes the steps of preparing a semiconductor substrate of a first conductivity type, in which photoelectric conversion regions are defined, forming a well of a second conductivity type in a surface of the semiconductor substrate, forming a plurality of first impurity regions of the first conductivity type in the well in the photoelectric conversion regions, forming a plurality of vertical charge transfer regions in one direction in the well between the photoelectric conversion regions, forming a gate insulating film on the semiconductor substrate, forming a plurality of transfer gates on the gate insulating film over each of the vertical charge transfer regions, forming a first insulating film on a surface of each transfer gate, forming a plurality of second impurity regions of the second conductivity type in a surface of the first impurity regions, forming a second insulating film at sides of the first insulating film, selectively removing the exposed gate insulating film, forming a light-shielding layer on the first and second insulating films, the light-shielding layer being connected with the photoelectric conversion devices, and forming a third insulating film on the light-shielding layer including each of the photoelectric conversion devices.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 4:
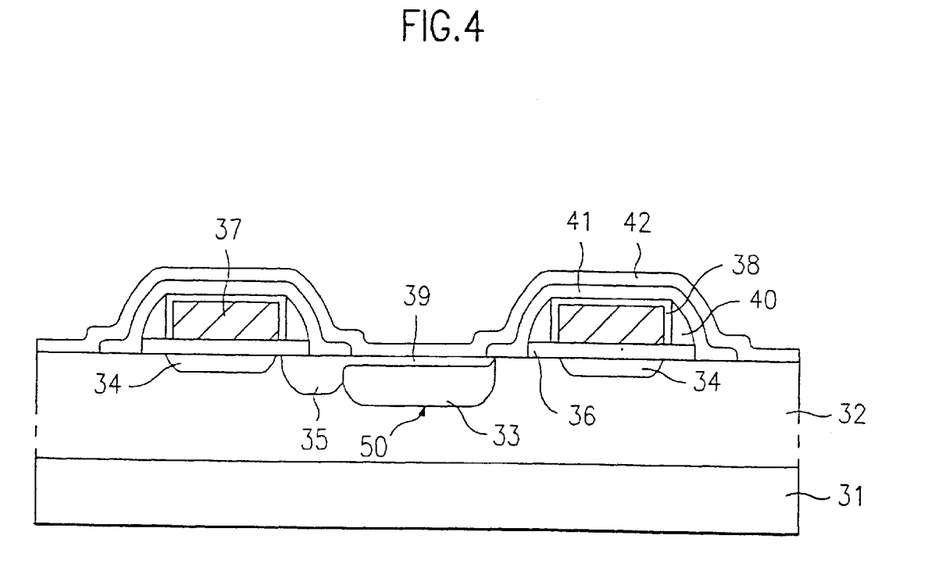
FIG. 4 is a sectional view illustrating a solid state image sensor according to a preferred embodiment of the present invention.

As shown in FIG. 4, a solid state image sensor according to the present invention includes a p-type conductivity well 32 formed in a surface of an n-type conductivity semiconductor substrate 31 in which a photoelectric conversion region is defined. A photoelectric conversion device 50 (i.e., photodiode) is formed of a PD-N region and a PD-P region 39 in a surface of the p-type conductivity well 32 in the photoelectric conversion region, for converting a signal of light to an electrical signal. A vertical charge transfer region 34 is formed in a surface of the p-type conductivity well in which the photodiode is not formed, and a channel stop layer 35 is formed in a surface of the p-type conductivity well 32 around the PD-N region except for a region between one side of the photodiode and the vertical charge transfer region 34.

A gate insulating film 36 is formed on the semiconductor substrate 31 except for the photodiode, and a transfer gate 37 is formed on the gate insulating film 36. A first insulating film 38 is formed on the transfer gate 37, and a second insulating film 40 is formed on the gate insulating film 36 at both sides of the transfer gate 37. A light-shielding layer 41 is formed at the sides of the photodiode and on the first and second insulating films 38 and 40 to be electrically connected with the photodiode. A third insulating film 42 is formed on the light-shielding layer 41 including the photodiode.

Figure 5A:
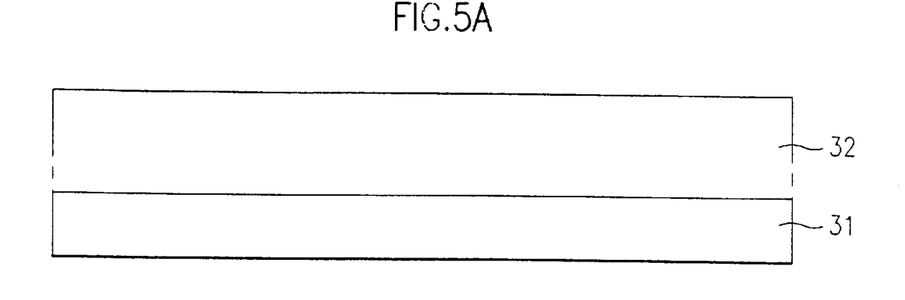
FIGS. 5A to 5G are sectional views illustrating a method for fabricating a solid state image sensor according the preferred embodiment of the present invention.

A method for fabricating the solid state image sensor of the present invention will be described with reference to FIGS. 5A to 5G. As shown in FIG. 5A, a p-type impurity ion is selectively implanted into a predetermined region in a surface of an n-type conductivity type semiconductor substrate 31 in which a photoelectric conversion region is defined. A p-type conductivity type well 32 is then formed by a drive-in diffusion process.

Figure 5B:
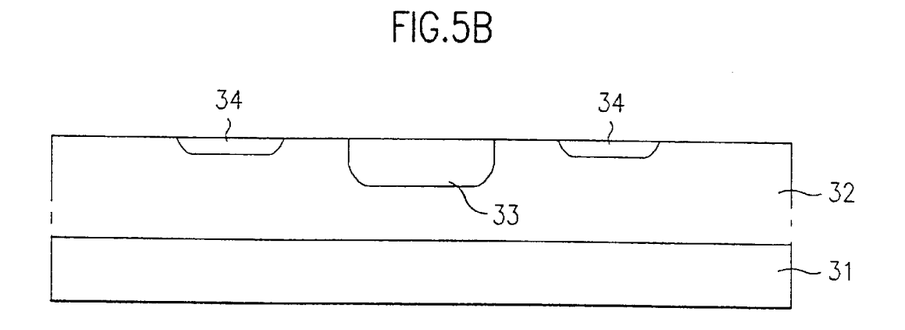

As shown in FIG. 5B, an n-type impurity ion is implanted into a surface of the p-type conductivity well 32 in the photoelectric conversion region. An n-type conductivity first impurity region 33 of a PD-N region is then formed by a drive-in diffusion process. Subsequently, a heavily doped n-type impurity ion is implanted into the surface of the p-type conductivity well 32 in which the PD-N region is not formed. A vertical charge transfer region 34 is then formed by a drive-in diffusion process.

Figure 5C:
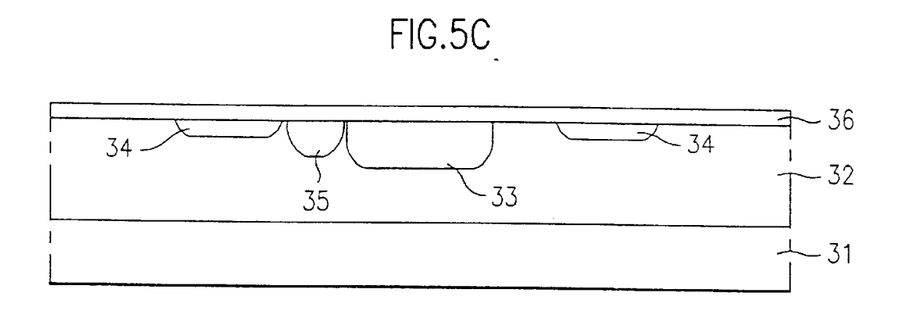

As shown in FIG. 5C, a heavily doped p-type impurity ion of energy lower than that to form the PD-region 33 is implanted into the surface of the p-type conductivity well 32 around the PD-N region except for a portion between one side of the PD-N region and the vertical charge transfer region 34. A channel stop layer 35 is then formed by a drive-in diffusion process. A gate insulating film 36 is formed on an entire surface of the semiconductor substrate 31, in which the vertical charge transfer region 34 and the channel stop layer 35 are formed.

Figure 5D:
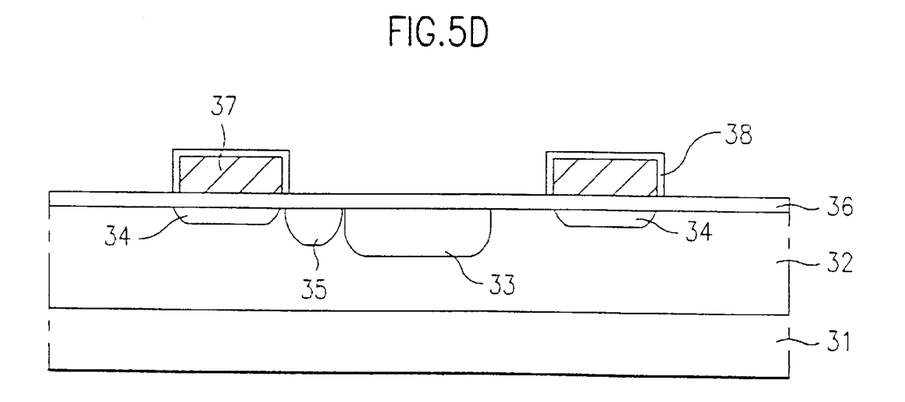

As shown in FIG. 5D, a polysilicon and a first photoresist are sequentially formed on the gate insulating film 36. The first photoresist is selectively patterned by exposure and developing processes to remain over the vertical charge transfer region 34. Subsequently, the polysilicon is selectively etched using the patterned first photoresist as a mask to form a transfer gate 37. The first photoresist is then removed. A second insulating film 38 is grown on a surface of the transfer gate 37 by a thermal oxidation process.

Figure 5E:
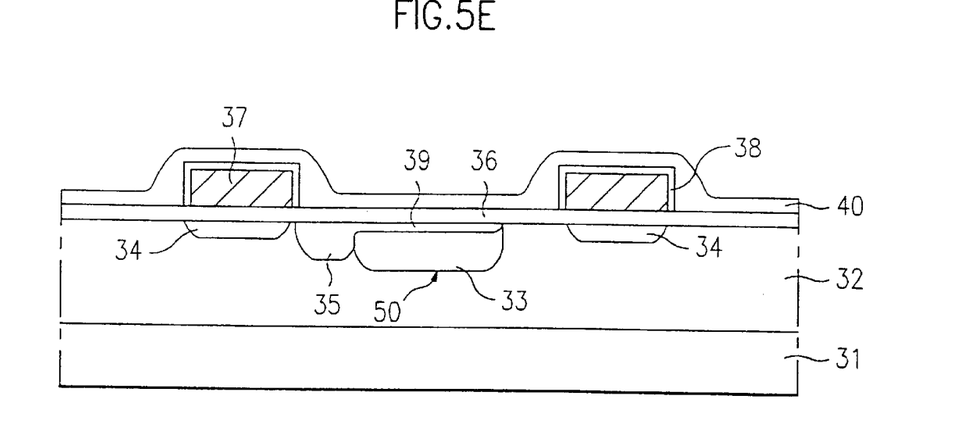

As shown in FIG. 5E, the heavily doped p-type impurity ion of energy lower than that to form the channel stop layer 35 is implanted into the surface of the p-type conductivity well 32 in the photoelectric conversion region. A PD-P region 39 is then formed with a thin thickness by a drive-in diffusion process. Thus, a photodiode with the PD-N region and the PD-P region 39 is formed. Thereafter, a second insulating film 40 is formed on the gate insulating film 36 including the first insulating film 38.

Figure 5F:
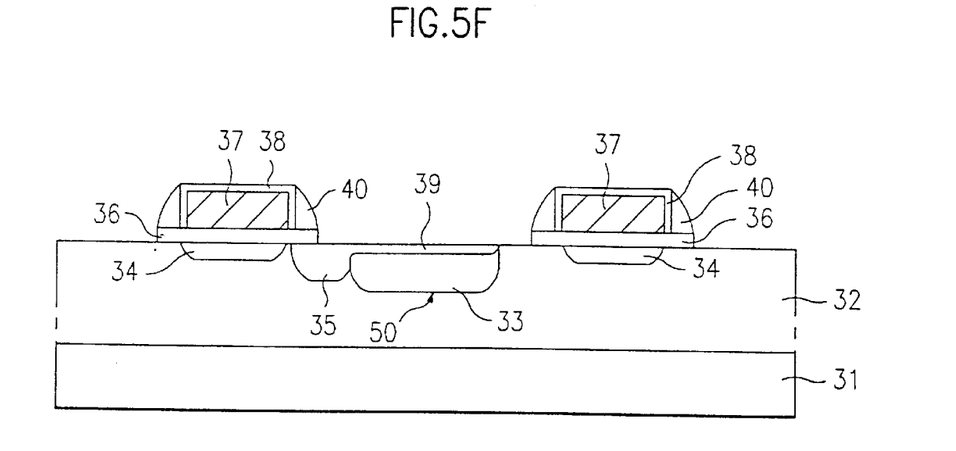

As shown in FIG. 5F, to remove the second insulating film 40 and the gate insulating film 36 over the photodiode, the second insulating film 40 and the gate insulating film 36 are sequentially etched back. Alternatively, to remove the second insulating film 40 and the gate insulating film 36 over the photodiode, a photoresist is deposited on the second insulating film 40 and then selectively patterned by exposure and developing processes, so that the photoresist remains only over the photodiode. Subsequently, the second insulating film 40 and the gate insulating film 36 are selectively etched using the patterned photoresist as a mask.

Figure 5G:
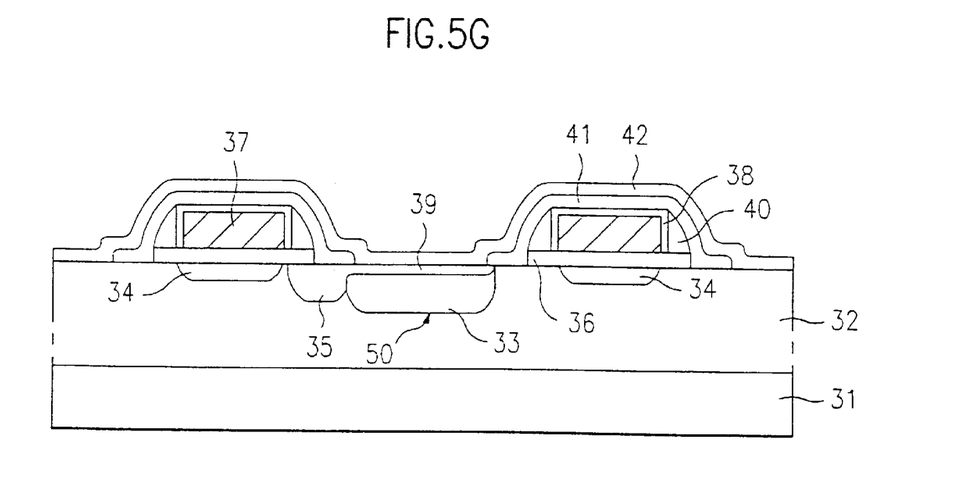

As shown in FIG. 5G, a light-shielding layer 41 and a second photoresist are sequentially formed on the entire surface including the second insulating film 40. The second photoresist is selectively patterned by exposure and developing processes so as to remain only over the photodiode. Subsequently, the light-shielding layer 41 is etched using the patterned second photoresist as a mask. The second photoresist is then removed. A third insulating film 42 is formed on the entire surface including the selectively etched light-shielding layer 41.

The light-shielding layer 41 is connected with either a ground terminal or an output gate. Alternatively, the light-shielding layer 40 is connected with the ground terminal to apply a positive voltage of 0 V or more to the light-shielding layer, and an inverter is formed between the light-shielding layer and the ground terminal.

In the solid state image sensor according to the present invention, a signal charge stored in the photodiode is transferred to the vertical charge transfer region 34 by a clock signal applied to the transfer gate 37 and then is moved in the vertical direction. A hole or a noise charge which occurs in a surface of the photodiode is connected with either the ground terminal or the output gate. Otherwise, a positive voltage of 0 V or more is applied to the hole/positive charge or the noise charge and then the charge, either positive or negative charges, e.g., hole or electrons, respectively, is removed in the light-shielding layer 41 connected with the PD-P region 39. Since the gate insulating film 36 over the photodiode is removed, incident light fails to directly flow to the vertical charge transfer region 34 through the gate insulating film 36.

The PD-N region is originally floating. However, if a high clock signal is applied to the transfer gate 37, the signal charge in the PD-N region is transferred to the vertical charge transfer region 34 and electrons are thus lost. As a result, the PD-N region is pinched off. In this state, if the signal charge occurs again, a potential of the PD-N region ascends but fails to ascend more than Vsdl of the p-type conductivity well 32.

The vertical charge transfer region 34 has high potential because a voltage of the transfer gate 37 is added to a pinched off potential of the PD-N region. At this time, a high voltage is applied to the transfer gate 37 because the device is operated by deep depletion mode.

The solid state image sensor and the method for fabricating the same according to the present invention have the various advantages. Since the light-shielding layer is connected with either the ground terminal or the output gate, or the light-shielding layer to which a positive voltage of 0 V or more is applied is electrically connected with the photodiode, the surface of the photodiode during the process steps is prevented from being damaged. In addition, although the noise charge may be caused by heavy metal contamination in the process steps, the noise charge is removed in the light-shielding layer so as not to flow to the photodiode. Further, since the gate insulating film is formed on the semiconductor substrate except for the photoelectric conversion region, the incident light is prevented from directly flowing to the vertical charge transfer region. This prevents the Smear phenomenon, thereby improving characteristics of the device.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method for fabricating a solid state image sensor comprising:

preparing a semiconductor substrate of a first conductivity type, in which photoelectric conversion regions are defined;

forming a well of a second conductivity type in a surface of the semiconductor substrate;

forming a plurality of first impurity regions of the first conductivity type in the well in the photoelectric conversion regions;

forming a plurality of vertical charge transfer regions in one direction in the well between the photoelectric conversion regions;

forming a gate insulating film on the semiconductor substrate;

forming a plurality of transfer gates on the gate insulating film over each of the vertical charge transfer regions;

forming a first insulating film on a surface of each transfer gate;

forming a plurality of second impurity regions of the second conductivity type in a surface of the first impurity regions;

forming a second insulating film at sides of the first insulating film;

selectively removing the exposed gate insulating film;

forming a light-shielding layer on the first and second insulating films, the light-shielding layer being connected with the photoelectric conversion devices; and forming a third insulating film on the light-shielding layer including each of the photoelectric conversion devices.

2. The method for fabricating a solid state image sensor of claim 1, wherein the first insulating film and the gate insulating film over the photoelectric conversion devices are removed by etch-back process.

3. The method for fabricating a solid state image sensor of claim 1, wherein the light-shielding layer is connected with a ground terminal.

4. The method for fabricating a solid state image sensor of 3, wherein the light-shielding layer is connected with the ground terminal by an inverter.

5. The method for fabricating a solid state image sensor of claim 1, wherein the light-shielding layer is connected with an output gate.

6. The method for fabricating a solid state image sensor of claim 1, wherein a positive voltage of 0V or more is applied to the light-shielding layer.

7. A method for fabricating a solid state image sensor comprising:

forming a well region in the substrate in which a photoelectric conversion region is defined;

forming a first charge transfer region in a surface of the well region and spaced from the photoelectric conversion region by a prescribed distance;

forming a first insulating film on the first charge transfer region;

forming a first conductor on the first insulating film;

forming second insulating film on the first conductor;

forming a second conductor, serving as an electromagnetic shielding layer, on the second insulating film, wherein the second conductor is coupled to the photoelectric conversion region.

8. The method of claim 7, wherein the first and second insulating films over the photoelectric conversion region are removed by an etch-back process.

9. The method of claim 7, wherein the second conductor is connected with a ground terminal.

10. The method of claim 9, wherein the second conductor is connected with the ground terminal by an inverter.

11. The method of claim 7, wherein the second conductor is connected with an output gate.

12. The method of claim 7, wherein a positive voltage of 0V or more is applied to the second conductor.

13. The method of claim 7, wherein the second conductor includes a portion formed on the well and extending between the first insulating film and the photoelectric conversion region and wherein the portion does not overlap the photoelectric conversion region.

* * * * *